United States Patent
Kuttner

(10) Patent No.: US 10,516,406 B1
(45) Date of Patent: Dec. 24, 2019

(54) DIGITAL TO ANALOG CONVERTER LINEARIZATION SYSTEM

(71) Applicant: Intel Corporation, Santa Clara, CA (US)

(72) Inventor: Franz Kuttner, St. Ulrich (AT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/233,553

(22) Filed: Dec. 27, 2018

(51) Int. Cl.
*H03M 1/08* (2006.01)
*H03M 1/00* (2006.01)

(52) U.S. Cl.
CPC ......... *H03M 1/0845* (2013.01); *H03M 1/004* (2013.01)

(58) Field of Classification Search
CPC ..... H03M 1/0845; H03M 1/004; H03G 3/007
USPC .......................................................... 341/144
See application file for complete search history.

(56) References Cited

U.S. PATENT DOCUMENTS

| | | | |
|---|---|---|---|
| 8,611,836 B2 * | 12/2013 | Ripley | H03G 3/007 455/127.2 |
| 8,994,566 B2 * | 3/2015 | Shiraishi | H03M 1/0845 341/120 |

* cited by examiner

*Primary Examiner* — Khai M Nguyen
(74) *Attorney, Agent, or Firm* — Schiff Hardin LLP

(57) ABSTRACT

A digital-to-analog converter (DAC) linearization system can include a DAC configured to generate an analog output signal based on a digital input signal, a detector configured to detect noise on a supply voltage and generate a noise detection signal based on the detected noise, and a compensator that is configured to generate a compensated analog signal based on the analog output signal and the noise detection signal.

24 Claims, 6 Drawing Sheets

US 10,516,406 B1

DIGITAL TO ANALOG CONVERTER LINEARIZATION SYSTEM

BACKGROUND

Field

Aspects described herein generally relate to digital-to-analog converters (DACs), including DACs implemented in wireless communication systems or devices, such as radio-frequency (RF) DACs and/or RF DACs including linearization systems.

Related Art

DACs may suffer from spurs, ripples, and/or other noise impacting their performance, such as spurs, ripples, and/or other noise on a supply voltage powering the DAC(s). DACs may include voltage regulators on the supply voltage system to compensate for such spurs/ripple/noise, but result in reduced power efficiency and increased power dissipation and heat associated with the voltage regulators.

BRIEF DESCRIPTION OF THE DRAWINGS/FIGURES

The accompanying drawings, which are incorporated herein and form a part of the specification, illustrate the aspects of the present disclosure and, together with the description, further serve to explain the principles of the aspects and to enable a person skilled in the pertinent art to make and use the aspects.

The exemplary aspects of the present disclosure will be described with reference to the accompanying drawings. The drawing in which an element first appears is typically indicated by the leftmost digit(s) in the corresponding reference number.

DETAILED DESCRIPTION

Figure 1:
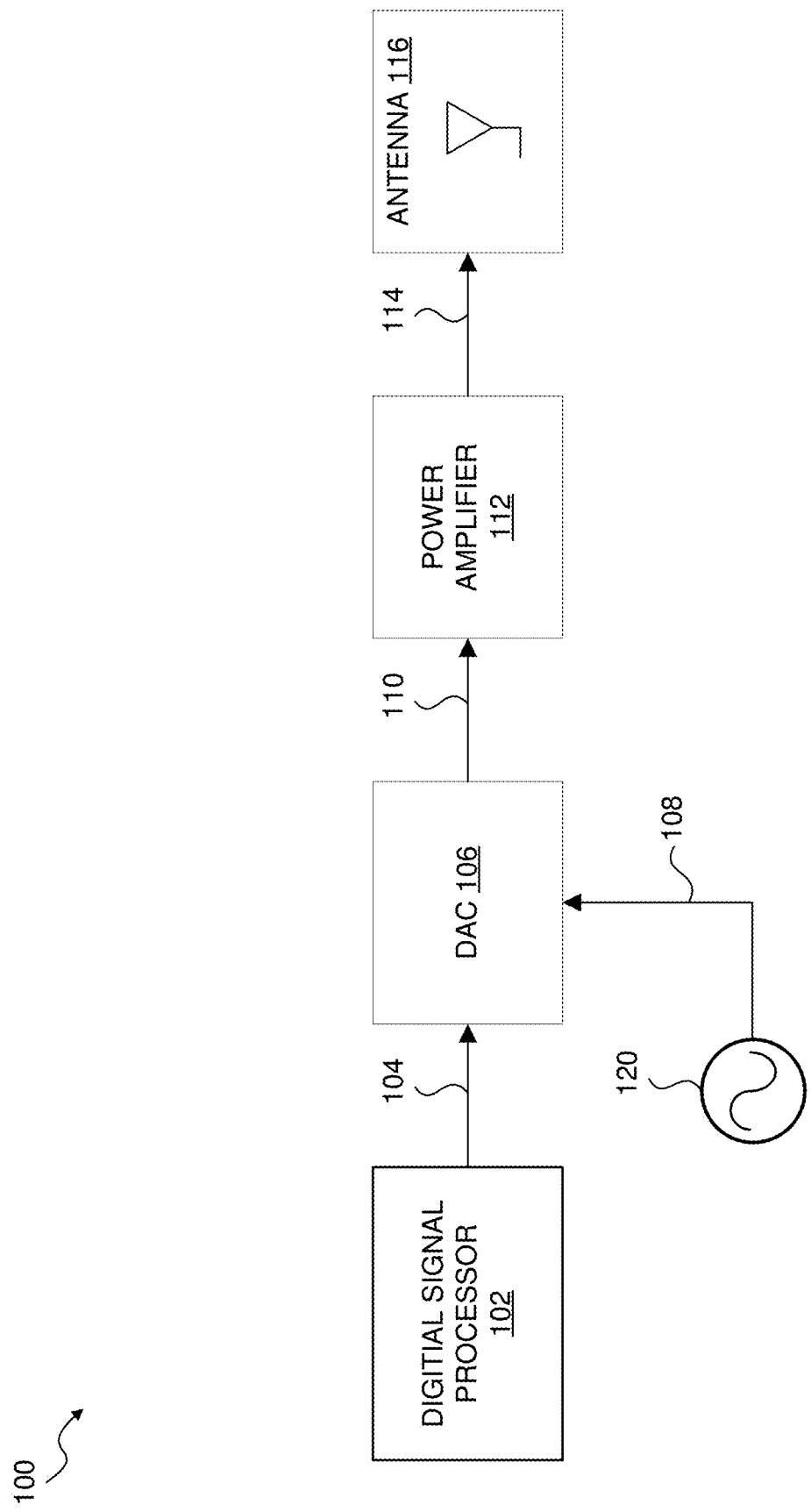
FIG. 1 illustrates a block diagram of a wireless transmitter according to an exemplary aspect of the present disclosure.

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

Aspects described herein generally relate to digital-to-analog converters (DACs), including DACs implemented in wireless communication systems or devices, such as radio-frequency (RF) DACs. Aspects can include linearization systems and method for compensating for spurs, ripples, and/or other noise impacting performance of one or more DACs, such as spurs, ripples, and/or other noise on a supply voltage powering the DAC(s). Aspects herein advantageously reduce or avoid the need or size of voltage regulators, such as low-dropout (LDO) regulators on the supply voltage system. This results in increased power efficiency by reducing the overall power dissipation and heat associated with LDO or other voltage regulators.

Aspects can also include wireless networks, wireless communications, and corresponding wireless communication devices implementing one or more DAC linearization systems and method of the present disclosure, including in one or more RF components (e.g. RF frontend) of a wireless communication device. For example, the DAC linearization systems are described with respect to radio-frequency digital-to-analog converters (RFDACs) of a transmitter in a wireless communication device. Although aspects are described with respect to wireless transmission, aspects are also applicable to wireless reception in which analog signals or information is converted to digital signals or information.

Wireless communications are expanding into communications having increased data rates (e.g., from Institute of Electrical and Electronics Engineers (IEEE) 802.11a/g to IEEE 802.11n to IEEE 802.11ac and beyond). Currently, fifth generation (5G) cellular communications and Wireless Gigabit Alliance (WiGig) standards are being introduced for wireless cellular devices and/or Wireless Local Area Networks (WLAN).

Some aspects of the present disclosure relate to wireless local area networks (WLANs) and Wi-Fi networks including networks operating in accordance with the Institute of Electrical and Electronics Engineers (IEEE) 802.11 family of standards, such as the IEEE 802.11ac, IEEE 802.11ad and IEEE 802.11ay standards, the IEEE 802.11ax study group (SG) (named DensiFi) and Wireless Gigabit Alliance (WiGig). Other Aspects of the present disclosure pertain to mobile wireless communication devices such as the 4G and 5G cellular communication standards. The technical field more specifically pertains to radar systems and radar systems that can be implemented in communication systems.

As an overview, DACs convert a multi-bit digital signal to an analog signal. The number of bits present in the multi-bit digital signal corresponds to the number of discrete values between which the analog signal can vary. For example, for a 5 Volt (V) system, an eight bit digital signal can represent 256 (i.e., $2^8$) different voltage values; where voltage values range from a minimum of 0V to a maximum of 5V with 254 voltage steps (i.e., a total of 256 voltage states), wherein each voltage step is spaced at 5/255 V from neighboring voltage steps. Thus, by varying the multi-bit digital input signal supplied to the DAC, the analog signals output by the DAC varies in a piecewise continuous manner rather than varying in a truly continuous analog manner. However, these output DAC signals are still being referred to as analog signals because of their analog character. Analog signals as provided by a DAC may be either voltage signals, also referred to as signals in the voltage domain, or current signals, also referred to as signals in the current domain.

FIG. 1 illustrates a simplified block diagram of a wireless transmitter 100 according to an exemplary aspect of the present disclosure. It should be noted that the simplified block diagram of FIG. 1 shows only some features of a transmitter, and additional elements, for example filters or the like, may also be present, even though not illustrated in this simplified block diagram.

In an exemplary aspect, the wireless transmitter 100 includes a digital signal processor (DSP) 102 configured to processes digital signals and output a digital transmit signal 104. The digitally processed signals may be obtained by digitizing analog signals received or otherwise obtained by the DSP 102. The digitally processed signals may also be digital data signals in the form of a text message, webpage, digital image, digital music file, or any other digitally encoded signal.

In an exemplary aspect, the DSP 102 is a baseband processor, but is not limited thereto. In an exemplary aspect, the DSP 102 includes processor circuitry that is configured to process digital signals. In an exemplary aspect, the DSP 102 is a digital signal processing circuit.

After being generated, digital transmit signal 104 is supplied to digital-to-analog converter (DAC) 106. The DAC 106 is configured to convert the digital transmit signal 104 to an analog signal (e.g., an analog current and/or voltage signal) and mix the digital transmit signal and/or analog signal with a local oscillator (LO) signal 108 (generated by LO 120) to output a mixed analog signal 110. In an exemplary aspect, the DAC 106 includes processor circuitry that is configured to convert the digital transmit signal 104 to an analog signal and mix the digital transmit signal and/or analog signal with a local oscillator (LO) signal 108 to output a mixed analog signal 110. In an exemplary aspect, the DAC 106 includes a plurality of cells that collectively deliver an analog signal. A cell generally refers to a portion of a DAC 106 which generates a cell output signal, and the overall analog output signal of the DAC 106 is based on the cell output signals of multiple cells or all cells of the DAC. In an exemplary aspect, to provide a smaller and more efficient architecture, the individual cells of the DAC 106 are capacitive DAC cells that include passive capacitor elements to generate current flow, but are not limited thereto. In an exemplary aspect, the cells of the DAC 106 are individual current sources.

The power amplifier 112 is configured to receive the mixed analog signal 110 to generate an amplified mixed analog signal 114, which is then wirelessly transmitted over an RF antenna 116. In an exemplary aspect, the power amplifier 112 includes processor circuitry that is configured to amplify an input signal to generate an amplified output signal.

The antenna 116 can include a single antenna element, or be formed of two or more antenna elements forming an integer array of antenna elements. In an exemplary aspect, the antenna 116 is a phased array antenna that includes multiple radiating elements (antenna elements), each of which can include a corresponding phase shifter. The antenna 116 configured as a phased array antenna can be configured to perform one or more beamforming operations that include generating beams formed by shifting the phase of the signal emitted from each radiating element to provide constructive/destructive interference so as to steer the beams in the desired direction. In an exemplary embodiment, two or more of the antenna elements of the antenna array are configured for wireless communication utilizing a MIMO configuration, and/or the communication device includes two or more antennas 116 configured for MIMO communications.

Figure 2:
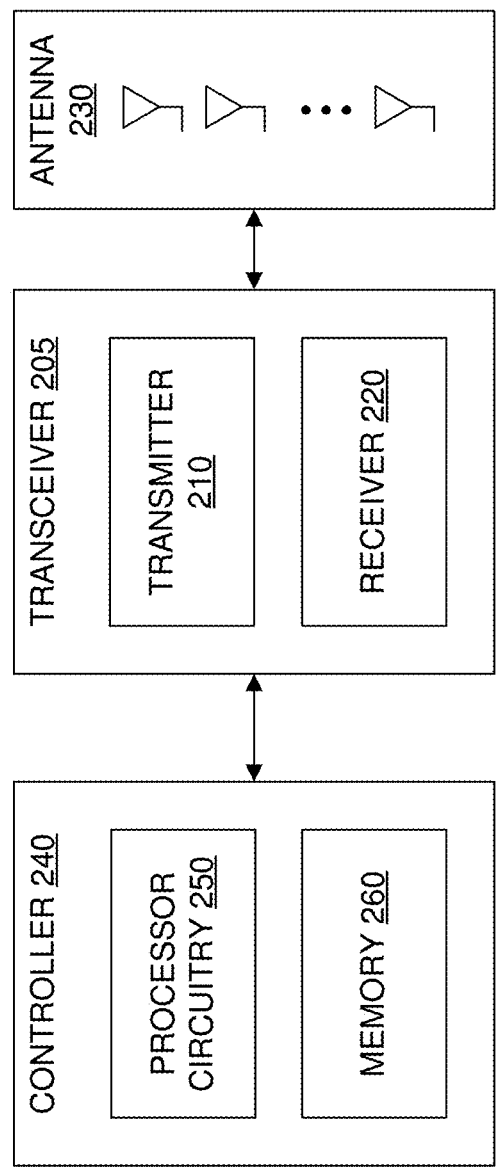
FIG. 2 illustrates a communication device having a radar system according to exemplary aspects of the present disclosure.

In an exemplary aspect, the wireless transmitter 100 can be implemented in a communication device 200 as illustrated in FIG. 2. In an exemplary aspect in which the wireless transmitter 100 is implemented in the communication device 200, the processor 250 includes the DSP 120, the transmitter 210 includes the DAC 106 and power amplifier 112, and the antenna 230 includes antenna 116.

In an exemplary aspect, the communication device 200 is configured to transmit and/or receive wireless communications based on one or more wireless technologies. For example, the communication device 200 can be configured for wireless communications conforming to, for example, one or more fifth generation (5G) cellular communication protocols, such as 5G protocols that use the 28 GHz frequency spectrum, and/or communication protocols conforming to the Wireless Gigabit Alliance (WiGig) standard, such as IEEE 802.11ad and/or IEEE 802.11ay that use the 60 GHz frequency spectrum. The communication device 200 is not limited to these communication protocols and can be configured for one or more additional or alternative communication protocols, such as one or more 3rd Generation Partnership Project's (3GPP) protocols (e.g., Long-Term Evolution (LTE)), one or more wireless local area networking (WLAN) communication protocols, and/or one or more other communication protocols as would be understood by one of ordinary skill in the relevant arts. For example, the communication device 200 can be configured to transmit and/or receive wireless communications using one or more communication protocols that utilize the millimeter wave (mmWave) spectrum (e.g., 24 GHz-300 GHz), such as WiGig (IEEE 802.11ad and/or IEEE 802.11ay) which operates at 60 GHz, and/or one or more 5G protocols using, for example, the 28 GHz frequency spectrum. In an exemplary aspect, the communication device 200 is configured for Multiple-input Multiple-output (MIMO) communications. In a MIMO operation, the communication device 200 may be configured to use multiple transmitting radio frequency (RF) chains (e.g. transmitters 100) and/or multiple receiving RF chains for wireless communications, thereby increasing the capacity of the radio link.

The communication device 200 can be configured to communicate with one or more other communication devices, including, for example, one or more base stations, one or more access points, one or more other communication devices, and/or one or more other devices as would be understood by one of ordinary skill in the relevant arts.

In an exemplary aspect, the communication device 200 includes a controller 240 operably (e.g. communicatively) coupled to one or more transceivers 205. The transceiver(s) 205 can be configured to transmit and/or receive wireless communications via one or more wireless technologies. In an exemplary aspect, the transceiver 205 can include processor circuitry that is configured for transmitting and/or receiving wireless communications conforming to one or more wireless protocols. For example, the transceiver 205 can include a transmitter 210 and a receiver 220 configured for transmitting and receiving wireless communications, respectively, via one or more antennas 230.

In aspects having two or more transceivers 205, the two or more transceivers 205 can have their own antenna 230, or can share a common antenna via a duplexer or other isolator. In an exemplary aspect, the transceiver 205 is configured to perform one or more radio frequency (RF) processing functions and/or baseband processing functions, such as media access control (MAC), encoding/decoding, filtering, modulation/demodulation (e.g. phase and/or amplitude modulation/demodulation), data symbol mapping, and/or error correction.

The antenna 230 can include one or more antenna elements forming an integer array of antenna elements. In an exemplary aspect, the antenna 230 is a phased array antenna that includes multiple radiating elements (antenna elements) each having a corresponding phase shifter. The antenna 230 configured as a phased array antenna can be configured to perform one or more beamforming operations that include generating beams formed by shifting the phase of the signal emitted from each radiating element to provide constructive/destructive interference so as to steer the beams in the desired direction. In an exemplary embodiment, two or more of the antenna elements of the antenna array are configured for wireless communication utilizing a MIMO configuration, and/or the communication device includes two or more antennas 230 configured for MIMO communications.

In an exemplary aspect, the controller 240 includes processor circuitry 250 that is configured to control the overall operation of the communication device 200, such as the operation of the transceiver(s) 205. The processor circuitry 250 can be configured to control the transmitting and/or receiving of wireless communications via the transceiver(s) 205. In an exemplary aspect, the processor circuitry 250 includes DSP 102 and is configured to processes digital signals and output a digital transmit signal (e.g. signal 104), which can be transmitted by transmitter 210 via antenna 230.

In an exemplary aspect, the processor circuitry 250 is configured to perform, alternatively or in cooperation with the transceiver 205, one or more radio frequency (RF) processing functions and/or baseband processing functions, such as media access control (MAC), encoding/decoding, filtering, modulation/demodulation (e.g. phase and/or amplitude modulation/demodulation), data symbol mapping, and/or error correction.

The processor circuitry 250 can be configured to run one or more applications and/or operating systems; power management (e.g., battery control and monitoring); display settings; volume control; and/or user interactions via one or more user interfaces (e.g., keyboard, touchscreen display, microphone, speaker, etc.).

The controller 240 can further include a memory 260 that stores data and/or instructions, where when the instructions are executed by the processor circuitry 250, controls the processor circuitry 250 to perform the functions described herein.

The memory 260 can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory 260 can be non-removable or removable, or a combination of both.

Examples of the communication device 200 include (but are not limited to) a mobile computing device (mobile device)—such as a laptop computer, a tablet computer, a mobile telephone or smartphone, a "phablet," a personal digital assistant (PDA), and mobile media player; a wearable computing device—such as a computerized wrist watch or "smart" watch, and computerized eyeglasses; and/or internet-of-things (IoT) device. In some aspects of the present disclosure, the communication device 200 may be a stationary communication device, including, for example, a stationary computing device—such as a personal computer (PC), a desktop computer, television, smart-home device, security device (e.g., electronic/smart lock), automated teller machine, a computerized kiosk, and/or an automotive/aeronautical/maritime in-dash computer terminal.

In one or more aspects, the communication device 200 (or one or more components of the communication device 200) can be additionally or alternatively configured to perform digital signal processing (e.g., using a digital signal processor (DSP)), modulation and/or demodulation (using a modulator/demodulator), a digital-to-analog conversion (DAC) and/or an analog-to-digital conversion (ADC) (using a respective DA and AD converter), encoding/decoding (e.g., using encoders/decoders having, for example, convolution, tail-biting convolution, turbo, Viterbi, and/or Low Density Parity Check (LDPC) encoder/decoder functionality), frequency conversion (using, for example, mixers, local oscillators, and filters), Fast-Fourier Transforms (FFT), preceding, and/or constellation mapping/de-mapping to transmit and/or receive wireless communications conforming to one or more wireless protocols, and/or facilitate beamforming scanning operations and/or beamforming communication operations.

Figure 3:
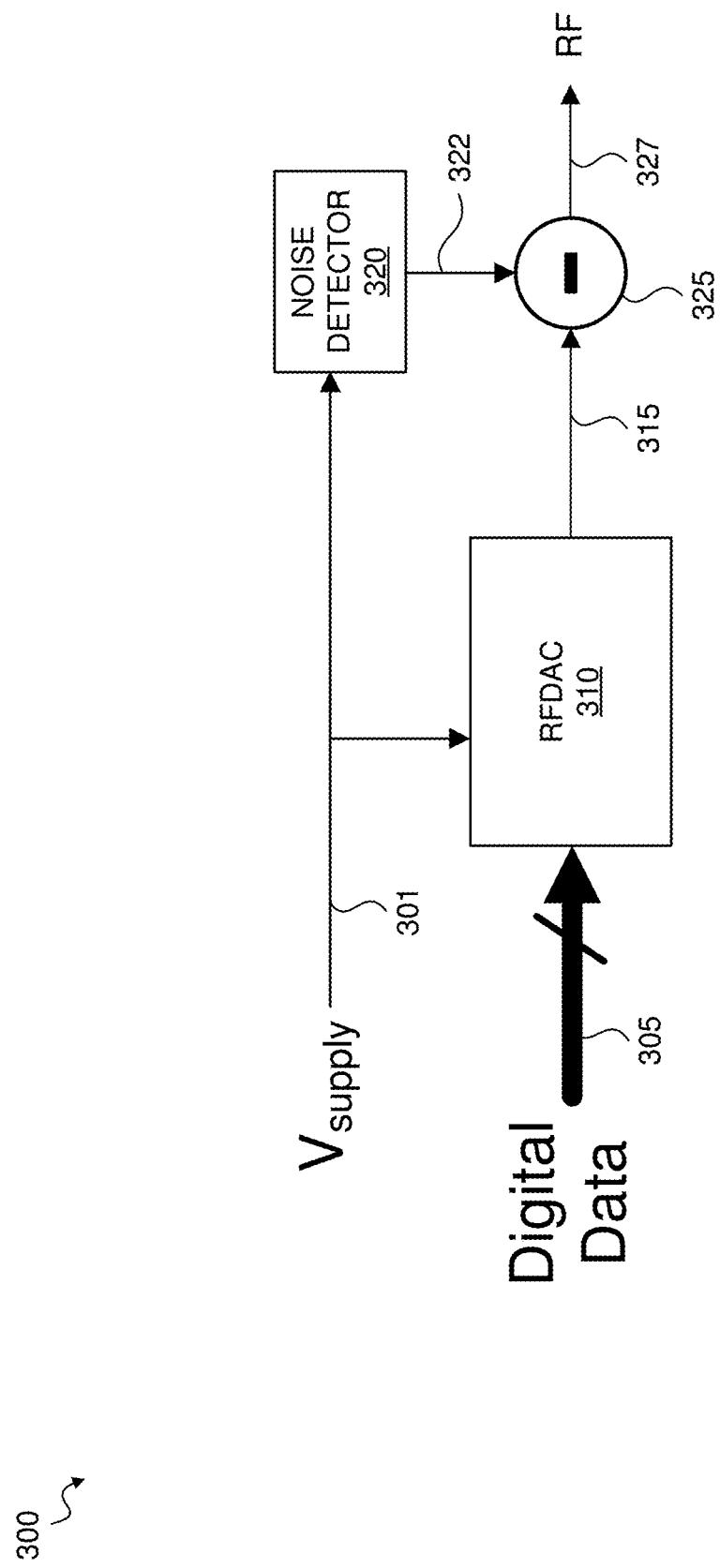
FIG. 3 illustrates a DAC linearization system according to an exemplary aspect of the present disclosure.

FIG. 3 illustrates a DAC linearization system 300 according to an exemplary aspect of the present disclosure. The DAC linearization system 300 includes a noise detector 320 and a compensator 325. In an exemplary aspect, the voltage supply ($V_{supply}$) 301 is supplied to the RFDAC 310 and the noise detector 320.

The RFDAC 310 receives a digital signal 305 and converts the digital signal 305 to an analog signal (e.g., an analog current and/or voltage signal) 315. In the example shown, the digital signal 305 is a multibit digital signal, but aspects are not limited thereto. In an exemplary aspect, the RFDAC 310 includes processor circuitry that is configured to convert the digital signal 305 to an analog signal 315.

The noise detector 320 is configured to detect spurs, ripples, and/or other noise on a supply voltage 301 and generate an output signal 322 corresponding to the detected noise. In an exemplary aspect, the noise detector 320 includes analog circuitry, digital circuitry, or a combination of both. In an exemplary aspect, the noise detector 320 includes processor circuitry that is configured to detect spurs, ripples, and/or other noise on a supply voltage 301 and generate an output signal 322 corresponding to the detected noise.

The compensator 325 is configured to subtract the output noise signal 322 from the analog signal 315 generated by the RFDAC 310 to generate an RF signal 327. In an exemplary aspect, the compensator 325 includes analog circuitry, digital circuitry, or a combination of both that is configured to subtract (or otherwise filter out) the output noise signal 322 from the analog signal 315. In another aspect, the compensator 325 includes processor circuitry configured to subtract (or otherwise filter out) the output noise signal 322 from the analog signal 315. The compensator 325 can be referred to as a subtractor in one or more aspects. In an exemplary aspect, the compensator 325 is an electronic mixer (e.g. an additive mixer) that is configured to combine two or more input signals to generate a composite output signal. In an exemplary aspect, the mixer 325 includes a resistor network (e.g. passive), active components such as buffer amplifiers, or other passive and/or active circuit components as would be understood by one of ordinary skill in the arts.

Figure 4:
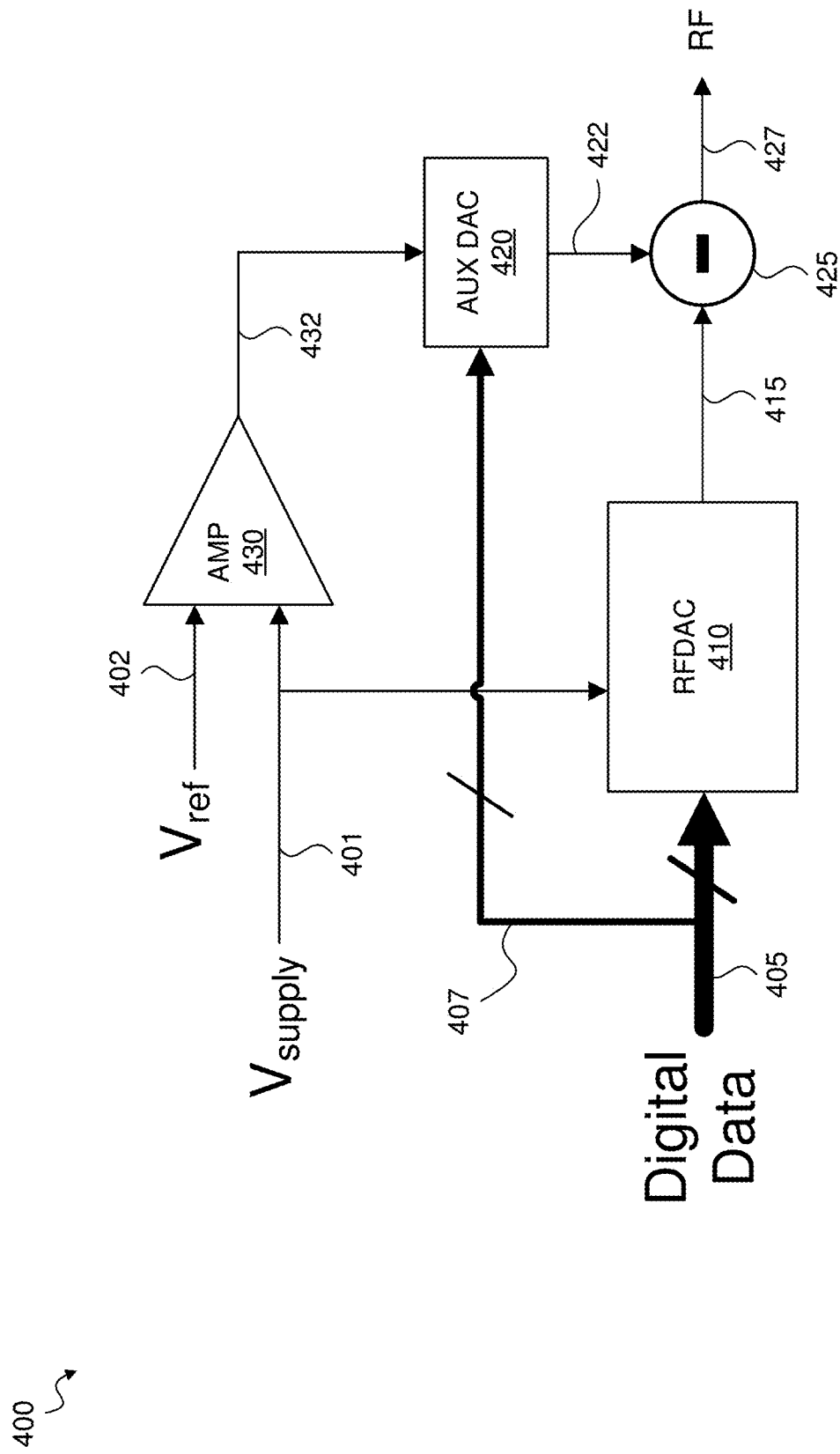
FIG. 4 illustrates a DAC linearization system according to an exemplary aspect of the present disclosure.

FIG. 4 illustrates a DAC linearization system 400 according to an exemplary aspect of the present disclosure. The DAC linearization system 400 is similar to the DAC linearization system 300 but includes an amplifier 430 and auxiliary DAC 420 that are configured to detect spurs, ripples, and/or other noise on a supply voltage 401 and generate an output signal 422 corresponding to the detected noise.

The RFDAC 410 is powered by the supply voltage 401 and receives a digital signal 405. The RFDAC is configured to convert the digital signal to an analog signal (e.g., an analog current and/or voltage signal) 415. In an exemplary aspect, the RFDAC 410 includes processor circuitry that is configured to convert the digital signal 305 to an analog signal 415.

In an exemplary aspect, a portion 407 of the digital signal 405 is also provide to the auxiliary DAC 420. In an exemplary aspect, digital signal 405 is a multibit digital signal and a digital signal 407 includes a subset of data bits of the multibit digital signal 405.

In an exemplary aspect, amplifier 430 receives the supply voltage 401 and a reference voltage 402 at its corresponding inputs and is configured to compare the supply voltage 401 and the reference voltage 402, and output a differential voltage 432 corresponding to the difference between the supply voltage 401 and the reference voltage 402. The differential voltage 432 serves at the supply voltage for the auxiliary DAC 420. In an exemplary aspect, the amplifier 430 is an operational amplifier, such as a differential amplifier. In an exemplary aspect, the amplifier 430 is a one stage structure to reduce latency. In an aspect, the amplifier 430 is configured to amplify one or more received signals and generate an amplified output signal based on the received signal(s). In an exemplary aspect, the amplifier 430 includes analog circuitry, digital circuitry, or a combination of both that is configured to perform one or more operations and/or functions of the amplifier 430, including comparing the supply voltage 401 and the reference voltage 402, and outputting a differential voltage 432 corresponding to the difference between the supply voltage 401 and the reference voltage 402. In another aspect, the compensator 425 includes processor circuitry configured to compare the supply voltage 401 and the reference voltage 402, and output a differential voltage 432 based on the comparison.

In an exemplary aspect, the auxiliary DAC 420 is configured to convert the digital signal 407 to an analog signal (e.g., voltage signal) 422. The analog signal is a correction signal having a power that is only a small percentage of the power of the RFDAC 410. If the supply voltage 401 has been reduced (e.g. from the nominal supply voltage, which may occur at full output power because of voltage drop) the auxiliary DAC 420 is configured to deliver additional voltage, which is added to the analog signal 415 by the compensator 425. If the supply voltage 401 is increased (e.g. exceeds a nominal supply voltage 401), the compensator 425 is configured to subtract a voltage from the analog output 415 of the RFDAC 410. In an exemplary aspect, the auxiliary DAC 420 includes processor circuitry that is configured to convert the digital signal 407 to an analog signal (e.g., voltage signal) 422.

The compensator 425 is similar to the compensator 325 and is configured to subtract the output noise signal 422 from the analog signal 415 generated by the RFDAC 410 to generate an RF signal 427. For example, the output noise signal 422 can have a negative or positive value depending on the differential between the reference voltage 401 and the supply voltage 401. This positive value or negative value (e.g. resulting in a subtraction) can be added to the analog signal 415. In an exemplary aspect, the compensator 425 is an analog mixer/adder that adds the output noise signal 422 (either having a positive, negative, or zero value) to the analog signal 415 to generate the RF signal 427.

In an exemplary aspect, the compensator 425 includes analog circuitry, digital circuitry, or a combination of both that is configured to subtract (or otherwise filter out) the output noise signal 422 from the analog signal. In another aspect, the compensator 425 includes processor circuitry configured to subtract (or otherwise filter out) the output noise signal 422 from the analog signal 415.

A correction on the main supply voltage 401 by the RFDAC 410 may be limited by the thermal noise performance and include a large blocking capacitor so as to provide 160 dBc far off the noise (e.g. power ratio of the noise signal to the carrier signal). Advantageously, in an exemplary aspect, the thermal noise performance of the supply voltage 432 of the auxiliary DAC 420 is relaxed because the auxiliary DAC 420 is contributing 20 to 30 dB less power to the output given its reduced size compared to the RFDAC 410. As a result, the supply voltage of the auxiliary DAC 420 can be manipulated in the gigahertz range.

In an exemplary aspect, the auxiliary DAC 420 is similar to the RFDAC 410 but is only a fraction of the size of the RFDAC 410. In an exemplary aspect, with its reduced size compared to the RFDAC 4210, the auxiliary DAC 420 is configured with a lower output power and lower resolution compared to the RFDAC 410 because the auxiliary DAC 420 is configured so as to only correct a small percentage of the overall supply voltage 410 that corresponds the ripple (or other noise) on the supply voltage 401.

Figure 5:
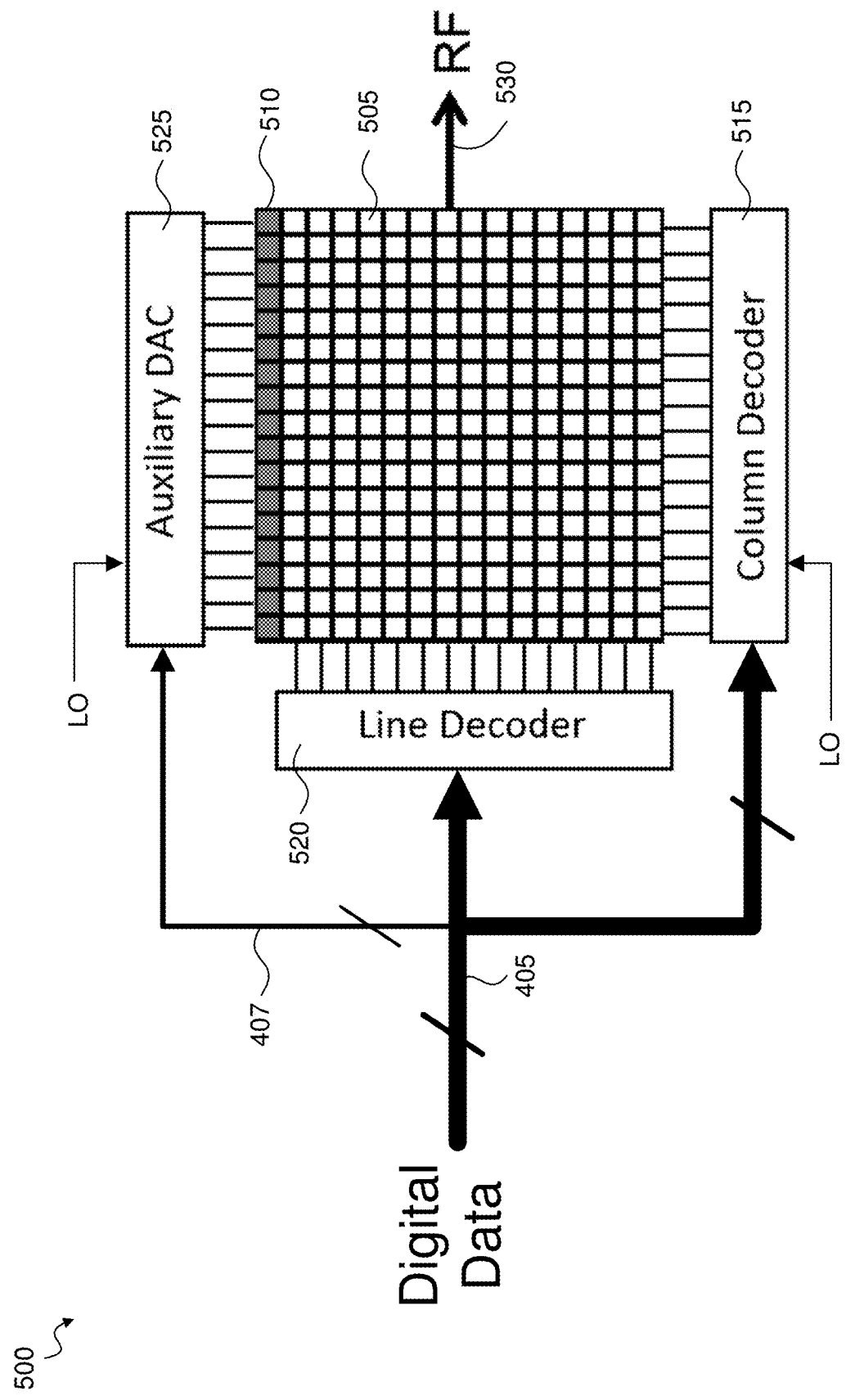
FIG. 5 illustrates a DAC linearization system according to an exemplary aspect of the present disclosure.

In an exemplary aspect, as illustrated in FIG. 5, the RFDAC 420 is comprised of a plurality of capacitive cells. In this example, a subset of cells of the overall cell array can be dedicated to the auxiliary DAC 420. For example, if the overall array of cells includes N×N cells (e.g. 32×32 array of cells), the auxiliary DAC 420 can be formed of 1/N cells (e.g. one line/column of a 32×32 array, where the RFDAC is formed by a 31×32 array). In this example, the auxiliary DAC 420 is configured to correct 1/N of the full amplitude of the supply voltage 401 can be corrected by the auxiliary DAC 420 (e.g. ±$\frac{1}{16}$, ±$\frac{1}{32}$ etc.)

With continued reference to FIG. 5, a DAC linearization system 500 according to an exemplary aspect is illustrated. The DAC linearization system 500 includes an array of cells 505 that form the RFDAC 410 and the auxiliary DAC 420. In an exemplary aspect, the cells 505 are capacitive cells, but are not limited thereto. In this example, the auxiliary DAC 420 is formed by a single line 510 of cells, while the remaining cells 505 form the RFDAC 410. The individual cells 505 of the RFDAC 410 are selectively activated by column decoder 515 and line decoder 520, while the cells of the auxiliary DAC 420 (i.e. line 510) are selectively activated by auxiliary DAC decoder 525.

In an exemplary aspect, the digital signal 405 is provided to the column decoder 515 and line decoder 520. A portion (e.g. subset of the bits) of the digital signal 405 is provided to the auxiliary DAC decoder 525. In an exemplary aspect, the most-significant bit (MSB) or the most-significant N-bits are provided as the portion of the digital signal 407 to the auxiliary DAC decoder 525. The portion of the digital signal 405 is not limited to the MSB(s) and can be another subset (e.g. least-significant bit(s), etc.) of bits of the digital signal 405 in one or more or aspects.

In operation, the column decoder 515 and line decoder 520 selectively activate the corresponding cells 505 while the auxiliary DAC decoder 525 selectively activates corresponding cells of the line 510 of cells to generate the analog RF output signal 530. In an exemplary aspect, the column and row decoders 515, 520 and the auxiliary DAC decoder 525 are configured to generate respective control signals to selectively activate corresponding cells. In an exemplary aspect, at least one of the control signals is modulated based on a LO signal (e.g. LO signal 108). Although FIG. 5 shows an example where the LO signal is provided to the column decoder 515 such that at least one column control signal is LO-modulated, the LO signal can alternatively be provided to the line decoder 520 such that at least one line control signal is LO modulated. The LO signal is also provided to the auxiliary DAC decoder 525 such that the auxiliary DAC control signal is LO modulated.

In the example of FIG. 5, the input of the DAC linearization system receives a multi-bit digital signal 405. The decoders 515 and 520, and auxiliary DAC decoder 525 are configured to generate corresponding control signals based on the digital signal 405 and digital signal 406 (portion of signal 405), respectively. When activated by a control signal from the decoders 515, 520, 525, a capacitor within each cell 505 of the cell array outputs, for example, a predetermined voltage and/or current. The voltage and/or current from any individual activated cells are summed to generate analog output signal 530. In an exemplary aspect, the decoders 515, 520, and/or 525 include processor circuitry configured to generate control signals based on the multi-bit digital signal.

In an exemplary aspect, the DAC linearization systems 300, 400, 500 advantageously reduce or avoid the need or size of voltage regulators, such as low-dropout (LDO) regulators on the supply voltage system. This results in increased power efficiency by reducing the overall power dissipation and heat associated with LDO or other voltage regulators. Conventionally, an LDO can be used for filtering the noise on the supply voltage, but increase the overall power loss of the system. Advantageously, aspects of the DAC linearization systems detect an alternative current (AC) portion (e.g. noise, spurs, ripple, etc.) of the supply voltage 401 and correct (e.g. filter or otherwise compensate) the supply voltage 401 to remove or reduce the detected noise. Consequently, the DAC linearization systems of the present disclosure omit or reduce the power loss over the LDO, and therefore improve the efficiency and the possible output power of the RFDAC 410.

Figure 6:
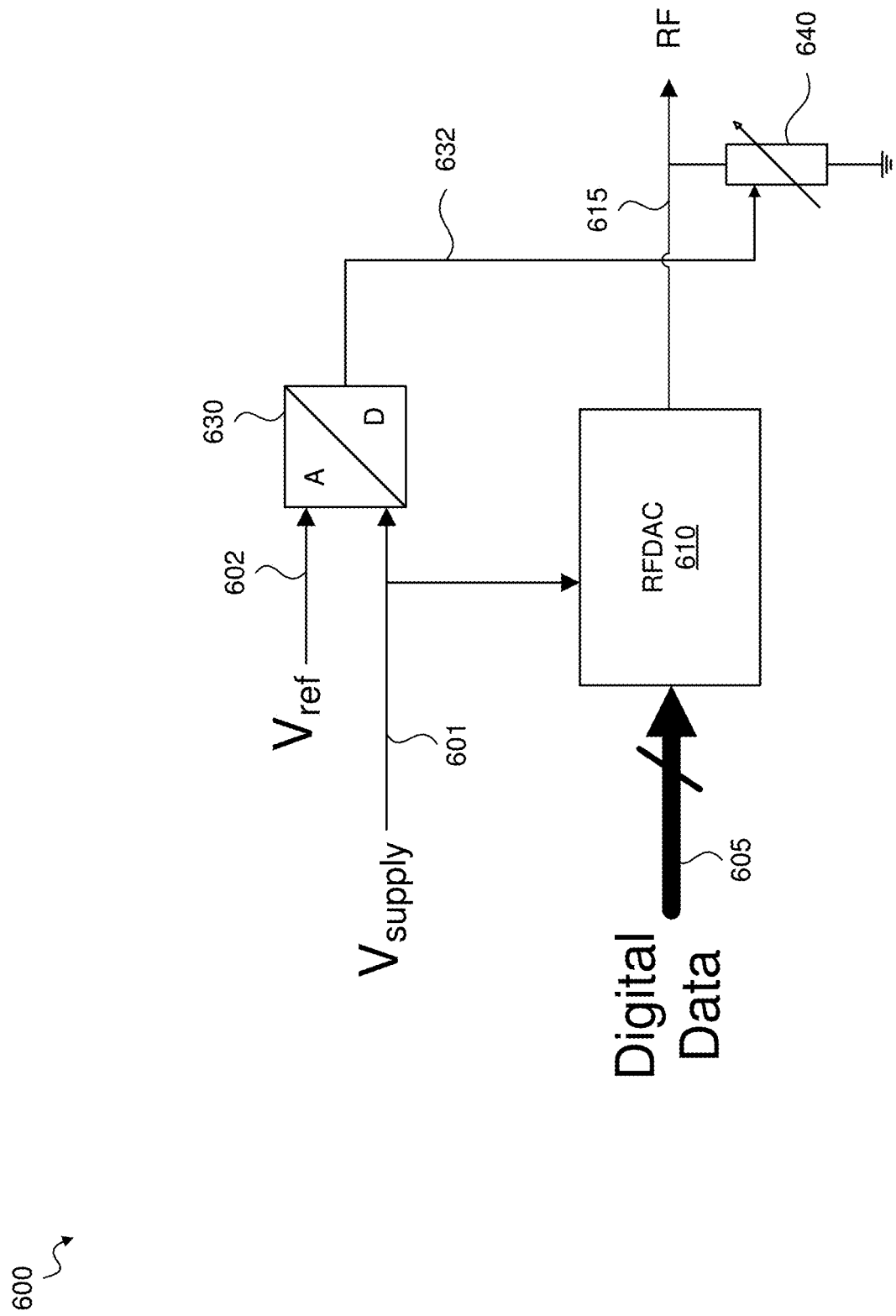
FIG. 6 illustrates a DAC linearization system according to an exemplary aspect of the present disclosure.

FIG. 6 illustrates a DAC linearization system 600 according to an exemplary aspect of the present disclosure. The DAC linearization system 600 is similar to the DAC linearization systems 300, 400 but includes an analog-to-digital converter (ADC) 630 configured to adjust an impedance of a variable impedance 640. The variable impedance 640 is configured to damp the analog output signal 615 generated by the RFDAC 610 to remove (or otherwise compensate for) spurs, ripples, and/or other noise on a supply voltage 601. In an exemplary aspect, the variable impedance 640 includes circuitry (e.g. analog circuitry such as resistors, inductors, and/or capacitors) configured to damp the analog output signal 615 generated by the RFDAC 610 to remove (or otherwise compensate for) spurs, ripples, and/or other noise on a supply voltage 601.

The RFDAC 610 is powered by the supply voltage 601 and receives a digital signal 605. The RFDAC 610 is configured to convert the digital signal to an analog signal (e.g., an analog current and/or voltage signal) 615. In an exemplary aspect, the RFDAC 610 includes processor circuitry that is configured to convert the digital signal 605 to an analog signal 615.

In an exemplary aspect, ADC 630 receives the supply voltage 601 and a reference voltage 602 at its corresponding inputs, and is configured to compare the supply voltage 601 and the reference voltage 602, and output a control signal 632 corresponding to the difference between the supply voltage 601 and the reference voltage 602. The control signal 632 controls the impedance of the variable impedance 640. In an exemplary aspect, the ADC 630 includes processor circuitry that is configured to compare the supply voltage 601 and the reference voltage 602, and output a control signal 632 corresponding to the difference between the supply voltage 601 and the reference voltage 602.

In an exemplary aspect, the ADC 630 is a window flash ADC, but is not limited thereto. In exemplary aspect, the variable impedance is a resistive DAC, but is not limited thereto. In an exemplary aspect, the ADC 630 can be substituted with an amplifier (e.g. amplifier 430) as described with reference to FIG. 4 and the variable impedance 640 is formed as a tunable resistor. In another aspect, the embodiments of FIGS. 4 and 6 combined to form alternative compensation systems, such as an amplifier-variable impedance configuration or an ADC-DAC configuration.

EXAMPLES

Example 1 is a digital-to-analog converter (DAC) linearization system, comprising: a DAC configured to generate an analog output signal based on a digital input signal; a detector configured to detect noise on a supply voltage and generate a noise detection signal based on the detected noise; and a compensator that is configured to generate a compensated analog signal based on the analog output signal and the noise detection signal.

Example 2 is the subject matter of Example 1, wherein the supply voltage is a voltage source of the DAC.

Example 3 is the subject matter of any of Examples 1-2, wherein the DAC is a radio-frequency DAC of a wireless transmitter.

Example 4 is the subject matter of any of Examples 1-3, wherein the compensator is an analog mixer configured to combine the analog output signal and the noise detection signal to generate the compensated analog signal.

Example 5 is the subject matter of any of Examples 1-4, wherein the detector comprises: an amplifier configured to generate an auxiliary supply voltage based on the supply voltage; and an auxiliary DAC configured to generate the noise detection signal based on the auxiliary supply voltage and the digital input signal.

Example 6 is the subject matter of Example 5, wherein the amplifier is configured to generate the auxiliary supply voltage based on the supply voltage and a reference voltage.

Example 7 is the subject matter of any of Examples 5-6, wherein the amplifier is configured to compare the supply voltage and a reference voltage, and generate the auxiliary supply voltage based on the comparison.

Example 8 is the subject matter of Example 7, wherein the auxiliary supply voltage is a difference between the supply voltage and the reference voltage.

Example 9 is the subject matter of any of Examples 5-8, wherein the auxiliary DAC configured to generate the noise detection signal based on the auxiliary supply voltage and a subset of bits of the digital input signal.

Example 10 is the subject matter of Example 9, wherein the subset of bits of the digital input signal includes the most-significant bit of the digital input signal.

Example 11 is the subject matter of any of Examples 1-10, wherein the DAC comprises a first plurality of capacitive cells and the auxiliary DAC comprises a second plurality of capacitive cells that are less than the first plurality of capacitive cells.

Example 12 is the subject matter of Example 11, wherein the first plurality of capacitive cells and the second plurality of capacitive cells are comprised within a same array of capacitive cells.

Example 13 is the subject matter of any of Examples 1-12, wherein the detector comprises: an analog-to-digital converter (ADC) configured to generate a control signal based on the supply voltage and a reference voltage; and a resistive DAC configured to adjust the analog output signal based on the control signal.

Example 14 is the subject matter of Example 13, wherein the resistive DAC is configured to damp the analog output signal to adjust the analog output signal.

Example 15 is the subject matter of any of Examples 1-14, wherein the detector comprises: an amplifier configured to generate a control signal based on the supply voltage and a reference voltage; and a variable impedance configured to vary its impedance based on the control signal to adjust the analog output signal.

Example 16 is a digital-to-analog converter (DAC) linearization system, comprising: a first DAC configured to generate an analog output signal based on a digital input signal, the first DAC being powered by a first supply voltage; an amplifier configured to generate a second supply voltage based on the first supply voltage and a reference voltage; a second DAC configured to generate a noise detection signal based on the auxiliary supply voltage and the digital input signal; and a mixer that is configured to generate a compensated analog signal based on the analog output signal and the noise detection signal.

Example 17 is the subject matter of Example 16, wherein the second supply voltage is a differential voltage of the first supply voltage and the reference voltage.

Example 18 is the subject matter of Example 16, wherein the second supply voltage is a difference of the first supply voltage and the reference voltage.

Example 19 is the subject matter of any of Examples 16-18, wherein the auxiliary DAC configured to generate the noise detection signal based on the auxiliary supply voltage and a subset of bits of the digital input signal.

Example 20 is the subject matter of Example 19, wherein the subset of bits of the digital input signal includes the most-significant bit of the digital input signal.

Example 21 is the subject matter of any of Examples 16-20, wherein the first DAC comprises a first plurality of capacitive cells and the second DAC comprises a second plurality of capacitive cells that are less than the first plurality of capacitive cells.

Example 22 is the subject matter of Example 21, wherein the first plurality of capacitive cells and the second plurality of capacitive cells are comprised within a same array of capacitive cells.

Example 23 is the subject matter of any of Examples 16-22, wherein the second DAC has a lower resolution than the first DAC.

Example 24 is a digital-to-analog converter (DAC) linearization system, comprising: digital-to-analog converting means for generating an analog output signal based on a digital input signal; detecting means for detecting noise on a supply voltage and generate a noise detection signal based on the detected noise; and compensating means for generating a compensated analog signal based on the analog output signal and the noise detection signal.

Example 25 is the subject matter of Example 24, wherein the supply voltage is a voltage source of the digital-to-analog converting means.

Example 26 is the subject matter of any of Examples 24-25, wherein the digital-to-analog converting means is a radio-frequency digital-to-analog converting means of a wireless transmitter.

Example 27 is the subject matter of any of Examples 24-26, wherein the compensating means is an analog mixer configured to combine the analog output signal and the noise detection signal to generate the compensated analog signal.

Example 28 is the subject matter of any of Examples 24-27, wherein the detecting means comprises: amplifying means for generating an auxiliary supply voltage based on the supply voltage; and auxiliary digital-to-analog converting means for generating the noise detection signal based on the auxiliary supply voltage and the digital input signal.

Example 29 is the subject matter of Example 28, wherein the amplifying means generates the auxiliary supply voltage based on the supply voltage and a reference voltage.

Example 30 is the subject matter of any of Examples 28-29, wherein the amplifying means compares the supply voltage and a reference voltage, and generates the auxiliary supply voltage based on the comparison.

Example 31 is the subject matter of Example 30, wherein the auxiliary supply voltage is a difference between the supply voltage and the reference voltage.

Example 32 is the subject matter of any of Examples 28-31, wherein the auxiliary digital-to-analog converting means generates the noise detection signal based on the auxiliary supply voltage and a subset of bits of the digital input signal.

Example 33 is the subject matter of Example 32, wherein the subset of bits of the digital input signal includes the most-significant bit of the digital input signal.

Example 34 is the subject matter of any of Examples 24-33, wherein the digital-to-analog converting means comprises a first plurality of capacitive cells and the auxiliary digital-to-analog converting means comprises a second plurality of capacitive cells that are less than the first plurality of capacitive cells.

Example 35 is the subject matter of Example 34, wherein the first plurality of capacitive cells and the second plurality of capacitive cells are comprised within a same array of capacitive cells.

Example 36 is the subject matter of any of Examples 24-35, wherein the detecting means comprises: analog-to-digital converting means for generating a control signal based on the supply voltage and a reference voltage; and a resistive digital-to-analog converting means for adjusting the analog output signal based on the control signal.

Example 37 is the subject matter of Example 36, wherein the resistive digital-to-analog converting means is configured to damp the analog output signal to adjust the analog output signal.

Example 38 is the subject matter of any of Examples 24-37, wherein the detecting means comprises: amplifying means for generating a control signal based on the supply voltage and a reference voltage; and a variable impedance means for varying its impedance based on the control signal to adjust the analog output signal.

Example 39 is a digital-to-analog converter (DAC) linearization system, comprising: first digital-to-analog converting means for generating an analog output signal based on a digital input signal, the first digital-to-analog converting means being powered by a first supply voltage; amplifying means for generating a second supply voltage based on the first supply voltage and a reference voltage; second digital-to-analog converting means for generating a noise detection signal based on the auxiliary supply voltage and the digital input signal; and mixing means for generating a compensated analog signal based on the analog output signal and the noise detection signal.

Example 40 is the subject matter of Example 39, wherein the second supply voltage is a differential voltage of the first supply voltage and the reference voltage.

Example 41 is the subject matter of Example 39, wherein the second supply voltage is a difference of the first supply voltage and the reference voltage.

Example 42 is the subject matter of any of Examples 39-41, wherein the auxiliary digital-to-analog converting means generates the noise detection signal based on the auxiliary supply voltage and a subset of bits of the digital input signal.

Example 43 is the subject matter of Example 42, wherein the subset of bits of the digital input signal includes the most-significant bit of the digital input signal.

Example 44 is the subject matter of any of Examples 39-43, wherein first digital-to-analog converting means comprises a first plurality of capacitive cells and the second digital-to-analog converting means comprises a second plurality of capacitive cells that are less than the first plurality of capacitive cells.

Example 45 is the subject matter of Example 44, wherein the first plurality of capacitive cells and the second plurality of capacitive cells are comprised within a same array of capacitive cells.

Example 46 is the subject matter of any of Examples 39-45, wherein the second digital-to-analog converting means has a lower resolution than the first digital-to-analog converting means.

Example 47 is a wireless communication device comprising the DAC linearization system of any of Examples 1-46.

Example 48 is an apparatus substantially as shown and described.

CONCLUSION

The aforementioned description of the specific aspects will so fully reveal the general nature of the disclosure that others can, by applying knowledge within the skill of the art, readily modify and/or adapt for various applications such specific aspects, without undue experimentation, and without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one aspect," "an aspect," "an exemplary aspect," etc., indicate that the aspect described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

The exemplary aspects described herein are provided for illustrative purposes, and are not limiting. Other exemplary aspects are possible, and modifications may be made to the exemplary aspects. Therefore, the specification is not meant to limit the disclosure. Rather, the scope of the disclosure is defined only in accordance with the following claims and their equivalents.

Aspects may be implemented in hardware (e.g., circuits), firmware, software, or any combination thereof. Aspects may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. A circuit includes an analog circuit, a digital circuit, state machine logic, other structural electronic hardware, or a combination thereof. A processor includes a microprocessor, a digital signal processor (DSP), central processing unit (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary aspects described herein, processor circuitry may include memory that stores data and/or instructions. The memory may be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

As will be apparent to a person of ordinary skill in the art based on the teachings herein, exemplary aspects are not limited to communication protocols that utilize the millimeter wave (mmWave) spectrum (e.g., 24 GHz-300 GHz), such as WiGig (IEEE 802.11ad and/or IEEE 802.11ay) which operates at 60 GHz, and/or one or more 5G protocols using, for example, the 28 GHz frequency spectrum. The exemplary aspects can be applied to other wireless communication protocols/standards (e.g., LTE or other cellular protocols, other IEEE 802.11 protocols, etc.) as would be understood by one of ordinary skill in the relevant arts.

What is claimed is:

1. A digital-to-analog converter (DAC) linearization system, comprising:
    a DAC configured to generate an analog output signal based on a digital input signal;
    a detector including an auxiliary DAC, and configured to detect noise on a supply voltage, wherein the auxiliary DAC is configured to generate a noise detection signal corresponding to the detected noise based on the digital input signal and an auxiliary supply voltage associated with the supply voltage; and a compensator that is configured to generate a compensated analog signal based on the analog output signal and the noise detection signal.

2. The system of claim 1, wherein the supply voltage is a voltage source of the DAC.

3. The system of claim 1, wherein the DAC is a radio-frequency DAC of a wireless transmitter.

4. The system of claim 1, wherein the compensator is an analog mixer configured to combine the analog output signal and the noise detection signal to generate the compensated analog signal.

5. The system of claim 1, wherein the detector further comprises:
an amplifier configured to generate the auxiliary supply voltage based on the supply voltage.

6. The system of claim 5, wherein the amplifier is configured to generate the auxiliary supply voltage based on the supply voltage and a reference voltage.

7. The system of claim 5, wherein the amplifier is configured to compare the supply voltage and a reference voltage, and generate the auxiliary supply voltage based on the comparison.

8. The system of claim 7, wherein the auxiliary supply voltage is a difference between the supply voltage and the reference voltage.

9. The system of claim 5, wherein the auxiliary DAC configured to generate the noise detection signal based on the auxiliary supply voltage and a subset of bits of the digital input signal.

10. The system of claim 9, wherein the subset of bits of the digital input signal includes the most-significant bit of the digital input signal.

11. The system of claim 5, wherein the DAC comprises a first plurality of capacitive cells and the auxiliary DAC comprises a second plurality of capacitive cells that are less than the first plurality of capacitive cells.

12. The system of claim 11, wherein the first plurality of capacitive cells and the second plurality of capacitive cells are comprised within a same array of capacitive cells.

13. The system of claim 1, wherein the detector comprises:
an analog-to-digital converter (ADC) configured to generate a control signal based on the supply voltage and a reference voltage; and
a resistive DAC configured to adjust the analog output signal based on the control signal.

14. The system of claim 13, wherein the resistive DAC is configured to damp the analog output signal to adjust the analog output signal.

15. The system of claim 1, wherein the detector comprises:
an amplifier configured to generate a control signal based on the supply voltage and a reference voltage; and
a variable impedance configured to vary its impedance based on the control signal to adjust the analog output signal.

16. A wireless communication device comprising the DAC linearization system of claim 1.

17. A digital-to-analog converter (DAC) linearization system, comprising:
a first DAC configured to generate an analog output signal based on a digital input signal, the first DAC being powered by a first supply voltage;
an amplifier configured to generate an auxiliary supply voltage based on the first supply voltage and a reference voltage;
a second DAC configured to generate a noise detection signal based on the auxiliary supply voltage and the digital input signal; and
a mixer that is configured to generate a compensated analog signal based on the analog output signal and the noise detection signal.

18. The system of claim 17, wherein the second supply voltage is a differential voltage of the first supply voltage and the reference voltage.

19. The system of claim 17, wherein the second supply voltage is a difference of the first supply voltage and the reference voltage.

20. The system of claim 17, wherein the auxiliary DAC configured to generate the noise detection signal based on the auxiliary supply voltage and a subset of bits of the digital input signal.

21. The system of claim 20, wherein the subset of bits of the digital input signal includes the most-significant bit of the digital input signal.

22. The system of claim 17, wherein the first DAC comprises a first plurality of capacitive cells and the second DAC comprises a second plurality of capacitive cells that are less than the first plurality of capacitive cells.

23. The system of claim 22, wherein the first plurality of capacitive cells and the second plurality of capacitive cells are comprised within a same array of capacitive cells.

24. The system of claim 17, wherein the second DAC has a lower resolution than the first DAC.

* * * * *